United States Patent
Ogata et al.

(10) Patent No.: US 9,112,169 B2
(45) Date of Patent: Aug. 18, 2015

(54) ORGANIC ELECTROLUMINESCENCE ILLUMINATING DEVICE AND METHOD FOR MANUFACTURING THE SAME

(71) Applicant: Sharp Kabushiki Kaisha, Osaka-shi (JP)

(72) Inventors: Hidenori Ogata, Osaka (JP); Emi Yamamoto, Osaka (JP); Yoshimasa Fujita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/264,032

(22) Filed: Apr. 28, 2014

(65) Prior Publication Data

US 2014/0231785 A1    Aug. 21, 2014

Related U.S. Application Data

(63) Continuation of application No. 13/382,510, filed as application No. PCT/JP2010/002668 on Apr. 13, 2010, now abandoned.

(30) Foreign Application Priority Data

Jul. 29, 2009    (JP) ................... 2009-176813

(51) Int. Cl.
| | | |
|---|---|---|
| H01J 9/00 | (2006.01) | |
| H01L 51/50 | (2006.01) | |
| H01L 51/52 | (2006.01) | |

(Continued)

(52) U.S. Cl.
CPC ........... *H01L 51/5012* (2013.01); *H01L 51/52* (2013.01); *H01L 51/5262* (2013.01); *H01L 51/56* (2013.01); *H05B 33/10* (2013.01); *H01L 2251/5361* (2013.01)

(58) Field of Classification Search
CPC ........................................ H01L 51/56
USPC ............................... 445/23, 24, 25
See application file for complete search history.

(56) References Cited

U.S. PATENT DOCUMENTS

| | | |
|---|---|---|
| 2003/0071567 A1 | 4/2003 | Eida et al. |
| 2003/0156080 A1 | 8/2003 | Koike et al. |
| 2003/0164679 A1 | 9/2003 | Hamano et al. |

(Continued)

FOREIGN PATENT DOCUMENTS

| | | |
|---|---|---|
| JP | 200040585 A | 2/2000 |
| JP | 2002319484 A | 10/2002 |
| JP | 2003150082 A | 5/2003 |
| JP | 20046366 A | 1/2004 |

(Continued)

OTHER PUBLICATIONS

International Search Report received for PCT Patent Application No. PCT/JP2010/002668, mailed on Jul. 6, 2010, 8 pages (4 pages of English Translation and 4 pages of PCT Search Report).

(Continued)

*Primary Examiner* — Anh Mai
*Assistant Examiner* — Zachary J Snyder
(74) *Attorney, Agent, or Firm* — Morrison & Foerster LLP

(57) ABSTRACT

An organic electroluminescence illuminating device (L) has a structure in which an organic electroluminescence element (10) is provided and encapsulated between a pair of substrates (20, 21). A light emitting surface of the organic electroluminescence element (10) has a portion which is not parallel to a light extraction surface of the entire illuminating device.

10 Claims, 3 Drawing Sheets

(51) Int. Cl.
*H05B 33/10* (2006.01)
*H01L 51/56* (2006.01)

(56) References Cited

U.S. PATENT DOCUMENTS

| | | | |
|---|---|---|---|
| 2003/0222578 | A1 | 12/2003 | Cok |
| 2005/0069012 | A1* | 3/2005 | Shimomura et al. ............ 372/87 |
| 2005/0170735 | A1* | 8/2005 | Strip ............................... 445/24 |
| 2006/0186806 | A1* | 8/2006 | Utsumi et al. ................ 313/506 |
| 2010/0047944 | A1* | 2/2010 | Kim ................................ 438/29 |
| 2011/0073876 | A1* | 3/2011 | Yoshida et al. ................. 257/88 |

FOREIGN PATENT DOCUMENTS

| | | |
|---|---|---|
| JP | 2004127627 A | 4/2004 |
| JP | 2005174914 A | 6/2005 |
| JP | 2006351211 A | 12/2006 |
| JP | 2008171993 A | 7/2008 |
| JP | 200932528 A | 2/2009 |

OTHER PUBLICATIONS

Office Action received for U.S. Appl. No. 13/382,510, mailed on Jun. 14, 2013, 11 pages.

* cited by examiner

ORGANIC ELECTROLUMINESCENCE ILLUMINATING DEVICE AND METHOD FOR MANUFACTURING THE SAME

CROSS REFERENCE TO RELATED APPLICATIONS

This application is a continuation of U.S. patent application Ser. No. 13/382,510, filed Jan. 5, 2012, which is the U.S. National Phase patent application of PCT/JP2010/002668, filed Apr. 13, 2010, which claims priority to Japanese Patent Application No. 2009-176813, filed Jul. 29, 2009, each of which is hereby incorporated by reference in the present disclosure in its entirety.

TECHNICAL FIELD

The present invention relates to organic electroluminescence illuminating devices and method for manufacturing the organic electroluminescence illuminating devices.

BACKGROUND ART

In recent years, these electronic devices made of organic materials have been actively studied. These electronic devices (organic electronic devices) can be mounted on flexible and large-area substrates and can be manufactured in a low-temperature process at low cost, for example. These advantages over conventional electronic devices made of inorganic materials are expected to realize, for example, practical flexible displays etc.

Examples of the organic electronic device includes organic electroluminescent (hereinafter referred to as "organic EL") device, organic photovoltaic cells, and organic field-effect transistors (organic FETs), etc.

The organic EL device includes an organic EL element in which an organic layer containing a luminescent material is interposed between a pair of electrodes. The organic EL element has characteristics, such as low voltage drive, high luminance, light emission capability, etc., and therefore, can have a smaller thickness and a lower weight. The organic EL device can be used in light source applications for optical communication and illumination applications in addition to display applications. For example, an organic EL illuminating device has many advantages, such as surface emission, smaller thickness, ease of dimming control, free of materials, such as mercury etc., which put a high load on the environment, etc.

Incidentally, when the organic EL device is used in illumination applications and optical communication applications, a higher emission luminance is required than in display applications. However, if a drive current is increased to enhance the luminance of the organic EL device, the organic EL element is more easily degraded, leading to a shorter lifetime of a device including the organic EL element.

For example, PATENT DOCUMENT 1 describes an organic EL illuminating device which includes an organic EL element including a large number of light emitting units having an emission area of 0.2 mm² or less arranged in a matrix, and can emit light with high luminance and high illuminance.

PATENT DOCUMENT 2 describes an EL illuminating device including a lens sheet having a minute uneven structure (including protruding portions and recessed portions) formed in a surface thereof. The lens sheet is provided on a side of an EL element from which light is emitted, to change the direction of emitted light. As a result, the luminance in the front direction can be enhanced and the lifetime of the EL element can be increased.

CITATION LIST

Patent Document

PATENT DOCUMENT 1: Japanese Patent Publication No. 2008-171993
PATENT DOCUMENT 2: Japanese Patent Publication No. 2009-32528

SUMMARY OF THE INVENTION

Technical Problem

An object of the present invention is to provide an organic EL illuminating device which can emit light with excellent emission luminance over a long period of time.

Solution to the Problem

An organic electroluminescence illuminating device according to the present invention has a structure in which an organic electroluminescence element is interposed between a pair of substrates facing each other. A light emitting surface of the organic electroluminescence element has a portion which is not parallel to a light extraction surface of the entire illuminating device.

With this configuration, the light emitting surface of the organic electroluminescence element has a portion which is not parallel to the light extraction surface of the entire illuminating device. Therefore, in a region where the corresponding light emitting surface and light extraction surface are not parallel to each other, light from the light emitting surface having a predetermined area is extracted from the light extraction surface having a smaller area than when the corresponding light emitting surface and light extraction surface are parallel to each other, resulting in a higher density of the amount of emitted light. In other words, the light emitting surface is not parallel to the light extraction surface of the entire illuminating device, resulting in excellent emission luminance.

In the organic electroluminescence illuminating device of the present invention, the light emitting surface of the organic electroluminescence element may be a curved surface.

The light emitting surface of the organic electroluminescence element may be a planar surface, and may be sloped relative to the light extraction surface of the illuminating device.

In the organic electroluminescence illuminating device of the present invention, the organic electroluminescence element is preferably made of a flexible material.

In the organic electroluminescence illuminating device of the present invention, at least one of the pair of substrates may be made of an optically transparent material.

In the organic electroluminescence illuminating device of the present invention, a space formed between the pair of substrates may be filled with a heat dissipating resin having a higher heat conductivity than that of the air.

With this configuration, the space formed between the pair of substrates is filled with the heat dissipating resin, and therefore, heat generated during light emission in the organic electroluminescence element can be efficiently transferred to the outside. Therefore, the heat during light emission more easily escapes to the outside, whereby accumulation of heat in the organic electroluminescence element which causes damage to the organic layer can be reduced or prevented.

In a method for manufacturing the organic electroluminescence illuminating device of the present invention, the organic electroluminescence element includes a first electrode, an organic electroluminescence layer, and a second electrode, which are successively stacked on a support base member, and steps of forming the first electrode, the organic layer, and the second electrode are performed on the support base member which is conveyed in roll-to-roll processing.

With this method, the electrodes and the organic layer can be continuously formed in a single formation chamber, resulting in a simpler manufacturing process and a smaller manufacturing apparatus.

Advantages of the Invention

According to the present invention, the light emitting surface of the organic electroluminescence element has a portion which is not parallel to the light extraction surface of the entire illuminating device. Therefore, in a region where the corresponding light emitting surface and light extraction surface are not parallel to each other, light from the light emitting surface having a predetermined area is extracted from the light extraction surface having a smaller area than when the corresponding light emitting surface and light extraction surface are parallel to each other, resulting in a higher density of the amount of emitted light. In other words, the light emitting surface is not parallel to the light extraction surface of the entire illuminating device, resulting in excellent emission luminance.

DESCRIPTION OF EMBODIMENTS

Embodiments of the present invention will be described in detail hereinafter with reference to the accompanying drawings.

First Embodiment

Organic EL Device

Figure 1:
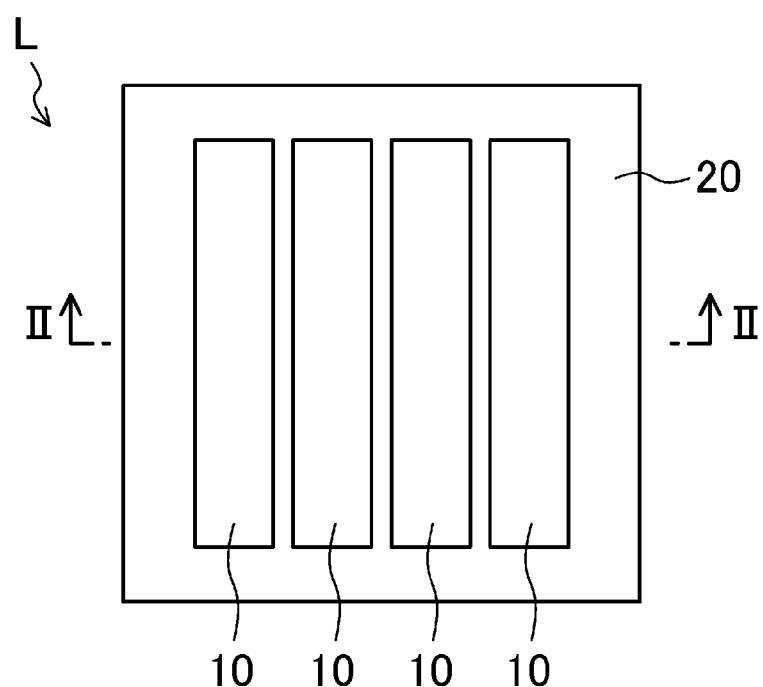
FIG. 1 is a plan view of an organic EL illuminating device according to a first embodiment.
Figure 2:
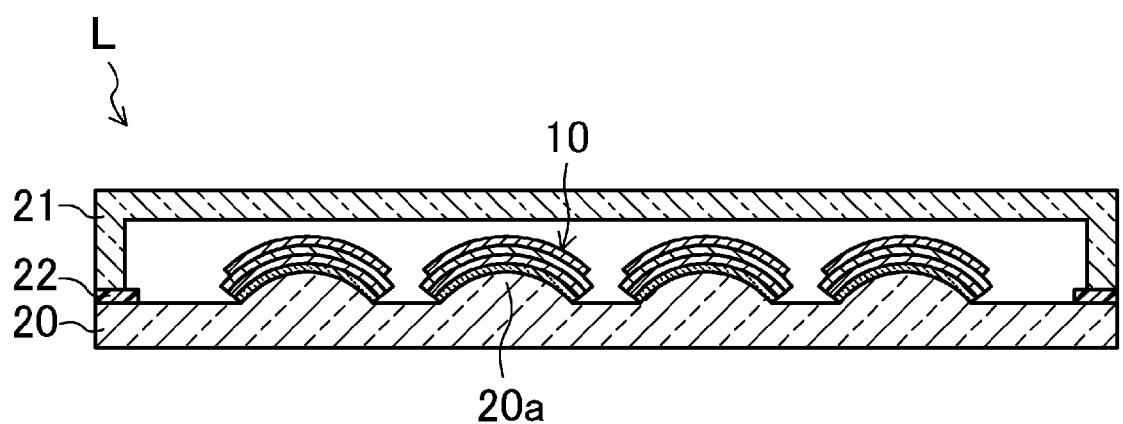
FIG. 2 is a cross-sectional view taken along line II-II of FIG. 1.

FIGS. 1 and 2 show an organic EL illuminating device according to a first embodiment. For example, the organic EL illuminating device L is used to illuminate a room or serve as a backlight for a liquid crystal display device.

In the organic EL illuminating device L, a first substrate 20 and a second substrate 21 are arranged to face each other, and an organic EL element 10 is interposed therebetween.

Figure 3:
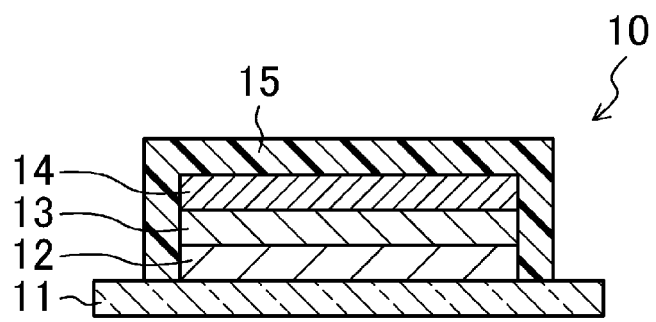
FIG. 3 is a cross-sectional view in a width direction of the organic EL element.
Figure 4:
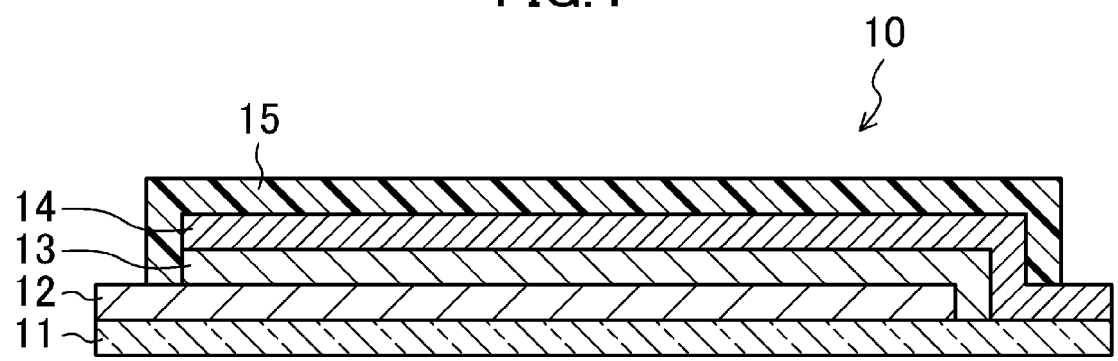
FIG. 4 is a cross-sectional view in a length direction of the organic EL element.

FIGS. 3 and 4 show the organic EL element 10. The organic EL element 10 includes a first electrode 12, an organic EL layer 13, and a second electrode 14, which are stacked on a support base member 11 and are covered with a protection film 15.

The support base member 11 includes a plastic film made of, for example, a styrene resin, an acrylic resin, polyethylene telephthalate (PET), polyethylene naphthalate (PEN), or polybutylene telephthalate (PBT), etc. The support base member 11 is in the shape of, for example, a tape having a width of about 1 cm, a length of about 15 cm, and a thickness of about 0.2 mm. The support base member 11 is preferably made of a flexible material whose shape can be changed, depending on a shape of an object to be fixed thereto. As a result, the organic EL element 10 is fixed and attached to even an object having a curved surface.

The first electrode 12 and the second electrode 14 may be an anode and a cathode, respectively, or vice versa. While holes are injected from the anode into the organic EL layer 13, electrons are injected from the cathode into the organic EL layer 13.

The anode is preferably made of a material having a high work function in order to enhance the efficiency of injecting holes into the organic EL layer 13. For example, the anode is preferably a transparent electrode made of a metal (e.g., Au, Ag, etc.) or ITO, etc.

The cathode is preferably made of a material having a low work function in order to enhance the efficiency of injecting electrons into the organic EL layer 13. The cathode may be formed of, for example: a multilayer structure of a metal having a low work function and a stable metal, such as Ca/Al, Ce/Al, etc.; an alloy, such as Ca:Al alloy, Mg:Ag alloy, etc.; or a multilayer structure of a thin insulating film and a metal electrode, such as LiF/Al etc.

For example, when the first electrode 12 is the anode and the second electrode 14 is the cathode, a reinforcement electrode made of, for example, an aluminum film may be provided at an end portion of a pattern in which the first electrode 12 is formed. The reinforcement electrode has a thickness of, for example, about 100 nm. The reinforcement electrode can reduce a voltage drop caused by the resistance of the electrode, whereby emission unevenness can be reduced or eliminated.

The organic EL layer 13 includes at least an emitting layer. The organic EL layer 13 may have a three-layer structure in which a hole transport layer, the emitting layer, and an electron transport layer are stacked together, or a five-layer structure in which a hole injection layer, a hole transport layer, the emitting layer, an electron transport layer, and an electron injection layer are stacked together, or a six-layer structure in which a hole injection layer, a hole transport layer, an electron blocking layer, the emitting layer, a hole blocking layer, and an electron injection layer are stacked together.

The hole injection layer and the hole transport layer have a function of efficiently injecting and transporting holes received from the anode to the emitting layer. Examples of a material for hole injection and transportation include aromatic tertiary amines, such as 4,4'-bis[N-(1-naphtyl)-N-phenylamino]biphenyl (α-NPD), N,N'-di(naphthalene-1-yl)-N, N'-diphenylbenzidine (NPD), etc., represented by:

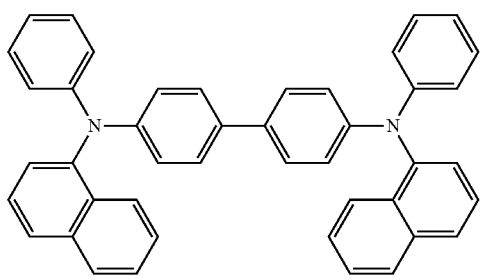 [SMILES: c1ccc(N(c2ccc(-c3ccc(N(c4ccccc4)c4cccc5ccccc45)cc3)cc2)c2cccc3ccccc23)cc1]

The hole injection layer and the hole transport layer have a thickness of, for example, about 30 nm and about 20 nm, respectively.

An electron blocking material for the electron blocking layer may be similar to the hole injection material. The electron blocking layer has a thickness of, for example, about 10 nm.

The emitting layer is made of a luminescent material doped with a dopant. Examples of the luminescent material include carbazole derivatives (e.g., 4,4'-bis(carbazole-9-yl)-biphenyl (CBP) etc.), triazole derivatives (e.g., 2,4-triazole etc.), etc., represented by:

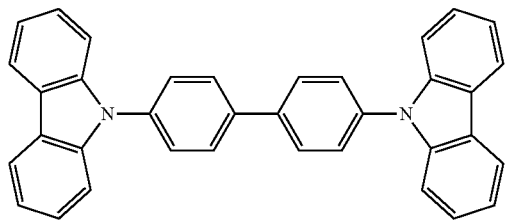 [SMILES: c1ccc2c(c1)c1ccccc1n2-c1ccc(-c2ccc(-n3c4ccccc4c4ccccc43)cc2)cc1]

Examples of the dopant include (2-phenylpyridine)iridium (Ir(ppy)$_3$) (green dopant) represented by:

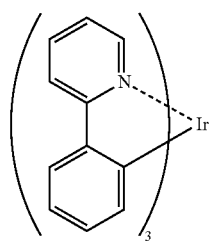

iridium(III)bis(4',6'-difluorophenyl)-pyridinato-N,C2]picolinate (FIr(pic)) (blue dopant) represented by:

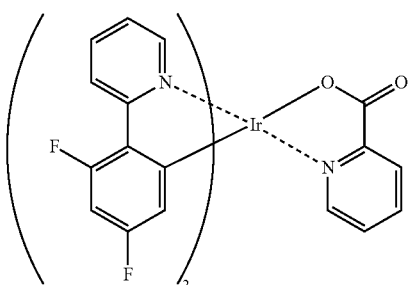

bis(2-(2'-benzo[4,5-a]thienyl)-pyridinato-N,C3')iridium (acetylacetonate) ((Btp)$_2$Ir(acac)) (red dopant) represented by:

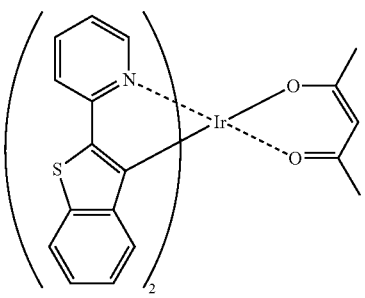

These dopants are injected in an amount of, for example, about 6 mass % relative to the luminescent material. The emitting layer has a thickness of, for example, about 30 nm.

Note that a green emitting layer, a blue emitting layer, and a red emitting layer doped with a green dopant, a blue dopant, and a red dopant, respectively, may be stacked together, whereby white light is obtained by mixing green, blue, and red light.

The hole blocking layer has a function of blocking holes from moving to the cathode. An example of the hole blocking material is 2,9-dimethyl-4,7-diphenyl-1,10-phenanthroline (BCP) represented by:

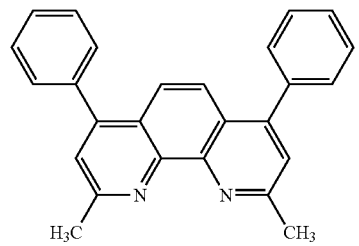 [SMILES: Cc1cc(-c2ccccc2)c2ccc3c(-c4ccccc4)cc(C)nc3c2n1]

The hole blocking layer has a thickness of, for example, about 10 nm.

The electron injection layer and the electron transport layer have a function of efficiently injecting and transporting electrons received from the cathode to the emitting layer. An example of a material for electron injection and transportation is tris(8-quinolinyloxy) aluminum (Alq3) represented by:

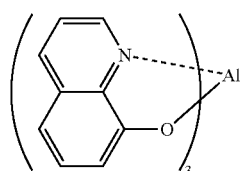

The electron transport layer and the electron injection layer have a thickness of, for example, about 30 nm and about 1 nm, respectively.

A protection film 15 may be further provided to cover the second electrode 14, whereby external moisture etc. entering the organic EL layer 13 can be reduced or prevented. An example of a material for the protection film 15 is an insulating inorganic film made of SiON, SiO, or SiN, etc. The protection film 15 has a thickness of, for example, about 100 nm.

The organic EL element 10 is provided in a space formed between the first substrate 20 and the second substrate 21, and are encapsulated by the substrates in order to reduce or prevent damage due to external moisture and oxygen, etc. A plurality of the organic EL elements 10 are provided between the pair of substrates. The number of the organic EL elements 10 provided between the pair of substrates 20 and 21 is, for example, 2-20 (in FIG. 2, the number of the organic EL elements 10 is 4). Note that only one organic EL element 10 may be provided between the pair of substrates 20 and 21.

The first substrate 20 and the second substrate 21 are each a planar plate-like transparent member including, for example, a glass substrate or a resin substrate, etc. The first substrate 20 and the second substrate 21 may each have, for example, a length of about 100 mm, a width of about 100 mm, and a thickness of about 0.7 mm. Note that if one of the first substrate 20 and the second substrate 21 through which light is extracted is a transparent member, the other substrate may not be transparent and may be made of, for example, a metal material. The first substrate 20 and the second substrate 21 may have a curved shape having a curved surface in addition to a planar plate-like shape.

The first substrate 20 has a raised portion(s) 20a on a surface thereof on which the organic EL element 10 is attached. The organic EL element 10 is attached to the raised portion 20a. As shown in FIG. 2, the raised portion 20a has an arc-shaped cross-section. The raised portion 20a has a height of, for example, 3-10 mm. The raised portion 20a is integrally formed with the first substrate 20. In this case, because the support base member 11 of the organic EL element 10 is made of a flexible material, the organic EL element 10 can be attached to the raised portion 20a while fitting a shape of the raised portion 20a, i.e., a light emitting surface of the organic EL element 10 is curved, extending along the shape of the raised portion 20a. Note that a separate member which serves as the raised portion 20a may be attached to the planar plate-like first substrate 20.

An extraction electrode is provided on a surface of the first substrate 20 on which the organic EL element 10 is attached. The first electrode 12 of the organic EL element 10 is electrically connected to the extraction electrode.

The first and second substrates 20 and 21 are arranged to face each other and sandwich the organic EL element 10. The first and second substrates 20 and 21 are sealed using a UV curable resin etc. to encapsulate the organic EL element 10. A space formed by the first and second substrates 20 and 21 is adjusted to an inert gas atmosphere (e.g., nitrogen, argon, etc.) or a vacuum atmosphere, whereby damage to the organic EL element 10 due to moisture or oxygen is reduced or prevented. The space formed by the first and second substrates 20 and 21 may additionally contain, for example, a moisture absorbent, such as barium oxide etc.

The organic EL elements 10 are spaced apart from each other and arranged side by side in the width direction. A space between each organic EL element 10 is, for example, about 5 mm.

The anodes of the organic EL elements 10 may be connected together and the cathodes of the organic EL elements 10 may be connected together. In this case, each organic EL element 10 can be easily connected to an external power supply.

In the organic EL illuminating device 10 thus configured, when a voltage is applied between the first electrode 12 and the second electrode 14, holes are injected into the emitting layer from the anode one of the first electrode 12 and the second electrode 14 and electrons are injected into the emitting layer from the cathode one of the first electrode 12 and the second electrode 14. The hole and the electron are recombined in the emitting layer to emit energy, which in turn excites the luminescent material of the emitting layer. When the excited luminescent material returns from the excited state to the ground state, fluorescent light or phosphorescent light is released and emitted to the outside.

Figure 5:
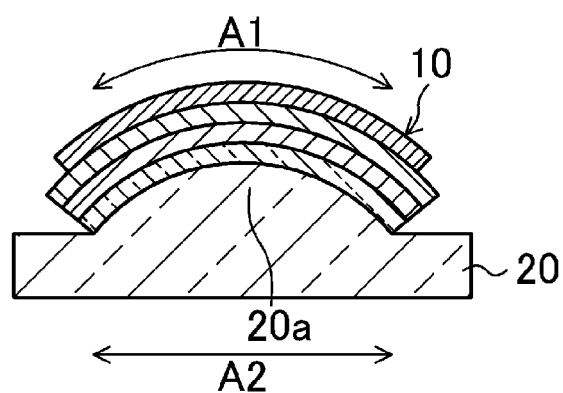
FIG. 5 is an enlarged view of a portion of the organic EL illuminating device.

In the organic EL illuminating device L of this embodiment, the raised portion 20a is formed on the surface of the first substrate 20, and therefore, when the organic EL element 10 is attached to the raised portion 20a, the light extraction surface of the entire illuminating device and the light emitting surface of the organic EL element 10 are not parallel to each other in a region where a surface of the raised portion 20a is sloped relative to the body of the first substrate 20. In this case, as shown in FIG. 5, the area (A1) of the light emitting surface is larger than the area (A2) of the light extraction surface, and therefore, the density of the amount of emitted light is higher than when the area of the light emitting surface is equal to the area of the light extraction surface. Therefore, the configuration of this embodiment can provide excellent emission luminance.

Method for Manufacturing Organic EL Illuminating Device

Next, a method for manufacturing the organic EL device L will be described.

Initially, a film tape which will be used as the support base member 11 of the organic EL element 10 is prepared. The film tape has, for example, a width of about 10 mm and a length of about 10 m. The film tape will be cut into pieces each having a length of, for example, 15 cm, which is a size of the organic EL element 10. Note that a series of manufacturing steps described below are performed in an inert gas atmosphere (e.g., nitrogen, argon, etc.) in a glovebox etc.

Figure 6:
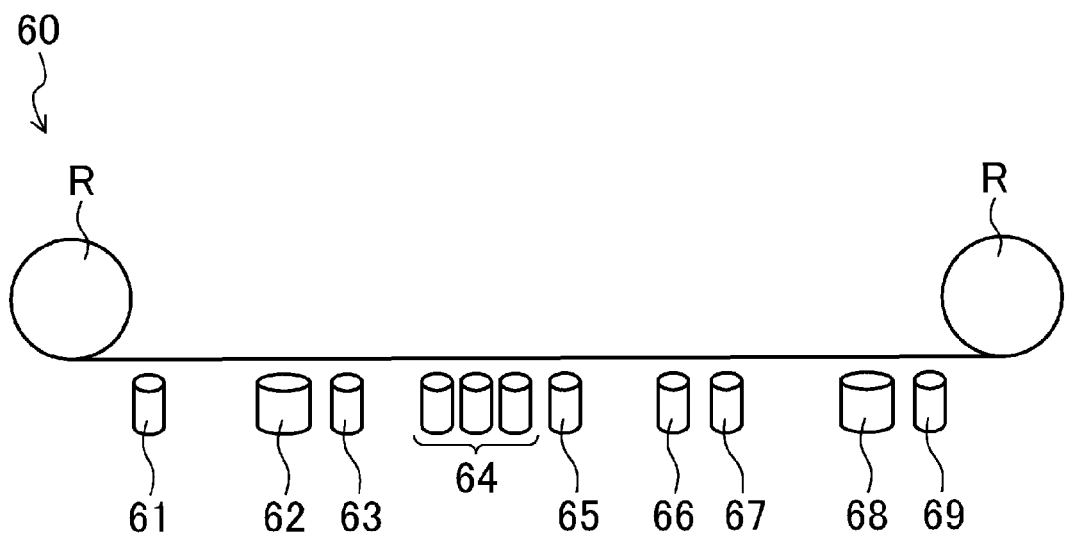
FIG. 6 is a diagram for describing a manufacturing process of the organic EL element.

Next, the support base member 11 is attached to a roll-to-roll vapor deposition device 60 shown in FIG. 6. The roll-to-roll vapor deposition device 60 includes, between two rolls R for winding the film tape, a cleaning section 61, a first electrode formation section 62, an etching section 63, an organic layer formation section 64, an etching section 65, a second electrode formation section 66, an etching section 67, a protection film formation section 68, and an etching section 69. The formation sections 62, 64, 66, and 68 are each means for forming a layer by vapor deposition.

Initially, the cleaning section 61 performs microwave plasma dry cleaning on a surface of the film tape.

Next, the first electrode formation section 62 forms, for example, an ITO film on an entire surface of the support base member 11. Thereafter, the etching section 63 etches the ITO film to form the first electrode 12. In this case, for example, the etching is performed so that the first electrode 12 has a rectangular pattern shape having a width which is equal to the width of the film tape and a predetermined length in the length direction of the film tape.

Next, the organic layer formation section 64 forms the organic layer 13 on an entire surface of the first electrode 12. Thereafter, the etching section 65 performs patterning on the organic layer 13.

Next, the second electrode formation section 66 forms the second electrode 14 on an entire surface of the organic layer 13. Thereafter, the etching section 67 performs patterning on the second electrode 14.

Moreover, the protection film formation section 68 forms a protection film 15 made of, for example, SiO$_2$, to cover the second electrode 14. Thereafter, the etching section 69 performs patterning on the protection film 15.

The film tape on which the first electrode 12, the organic EL layer 13, the second electrode 14, and the protection film 15 have been thus formed is wound around a roll R. Thereafter, the film tape is cut into pieces each having a predetermined length, where each piece is the organic EL element 10.

Next, the fabricated organic EL elements 10 are tested using a known technique. Thereafter, a defective product(s) is removed, and non-defective organic EL elements 10 are fixed to the first substrate 20 using a transparent thermosetting resin etc., and the organic EL elements 10 are electrically connected to the extraction terminal of the first substrate 20.

In this case, the organic EL element 10 is arranged on the raised portion 20a of the first substrate 20. The support base member 11 of the organic EL element 10 is made of a flexible material, and therefore, the organic EL element 10 can be attached to the raised portion 20a while fitting the shape of the raised portion 20a. When a plurality of the organic EL elements 10 are provided, the adjacent organic EL elements 10 may be spaced apart from each other. In this case, a space between the adjacent organic EL elements 10 is, for example, about 1-5 mm.

After the organic EL elements 10 are fixed onto the first substrate 20, the second substrate 21 is stacked on the first substrate 20 to cover the organic EL element 10, and the resultant structure is sealed using a UV curable resin etc. Thus, the organic EL device L of this embodiment can be fabricated.

Although a roll-to-roll vapor deposition device is used to fabricate the organic EL elements 10 in the above description, the organic EL element 10 may be fabricated using, for example, a single-wafer processing device including separate chambers for different steps of forming the electrodes and the organic layer instead of the roll-to-roll vapor deposition device.

Even when a roll-to-roll vapor deposition device is used to fabricate the organic EL element 10, the electrodes and the organic layer may be formed by simultaneously performing film formation and patterning by vapor deposition using a deposition mask instead of the above method in which an electrode formation film or an organic layer formation film is formed on an entire surface and then is etched.

Moreover, even when a roll-to-roll vapor deposition device is used to fabricate the organic EL element 10, a film tape on which the first electrode 12 has been previously formed may be wound around a roll and the roll may be set to the roll-to-roll vapor deposition device, and in the roll-to-roll vapor deposition device, only the organic EL layer 13, the second electrode 14, and the protection film 15 may be formed.

Second Embodiment

Organic EL Illuminating Device

Figure 7:
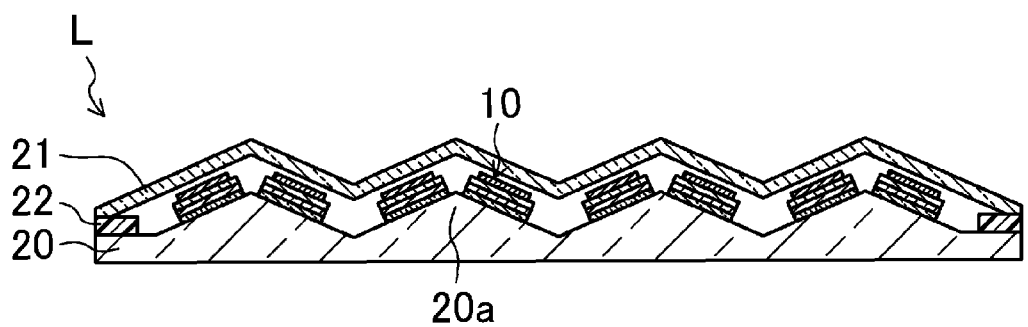
FIG. 7 is a cross-sectional view of an organic EL illuminating device according to a second embodiment.

Next, an organic EL illuminating device L according to a second embodiment will be described. FIG. 7 shows organic EL elements 10 according to the second embodiment. Note that the same components as those of the organic EL illuminating device L of the first embodiment are indicted by the same reference characters as those of the first embodiment.

Similar to the first embodiment, the organic EL illuminating device L has a structure in which a first substrate 20 and a second substrate 21 are arranged to face each other, and the organic EL element 10 is interposed therebetween.

In the organic EL element 10, a first electrode 12, an organic EL layer 13, and a second electrode 14 are stacked together on a support base member 11 and are covered with a protection film 15. The organic EL element 10 has the same configuration as that of the first embodiment.

The first substrate 20 is, for example, a planar plate-like transparent member, such as a glass substrate, a resin substrate, etc. The first substrate 20 has, for example, a length of about 100 mm, a width of about 100 mm, and a thickness of about 0.7 mm.

A raised portion 20a is provided on a surface of the first substrate 20 on which the organic EL elements 10 are attached, and the organic EL elements 10 are attached onto the raised portions 20a. The raised portion 20a has a surface sloped relative to the substrate, and a zigzag edge line in a cross-section thereof. The raised portion 20a has a height of, for example, 3-10 mm.

The second substrate 21 is formed of, for example, a transparent material (e.g., glass, resin, etc.) or a light reflective metal material. The second substrate 21 is a zigzag plate extending along the raised portion 20a of the first substrate 20. The second substrate 21 has, for example, a length of about 100 mm and a width of about 100 mm as viewed from above, and a thickness of about 0.7 mm.

In the organic EL illuminating device L thus configured, the raised portion 20a is formed on the surface of the first substrate 20, and therefore, when the organic EL element 10 is attached to the raised portion 20a, the light extraction surface of the illuminating device and the light emitting surface of the organic EL element 10 are not parallel to each other in a region where a surface of the raised portion 20a is sloped relative to the first substrate 20. Note that the light extraction surface of the entire illuminating device refers to a surface parallel to the plate surface of the first substrate 20. In this case, the area of the light emitting surface is larger than the area of the light extraction surface, and therefore, the density of the amount of emitted light is higher than when the area of the light emitting surface is equal to the area of the light extraction surface. Therefore, the configuration of this embodiment can provide excellent emission luminance.

The organic EL illuminating device L having the above configuration can be manufactured by the same method as that of the first embodiment.

Third Embodiment

Organic EL Illuminating Device

Figure 8:
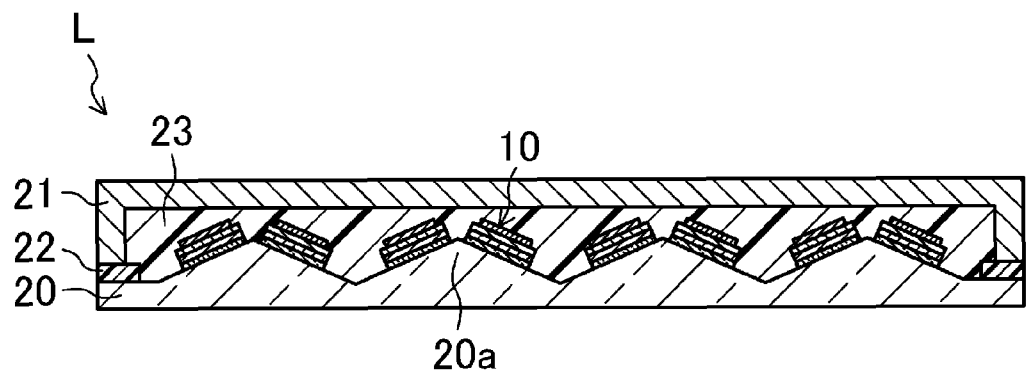
FIG. 8 is a cross-sectional view of an organic EL illuminating device according to a third embodiment.

Next, an organic EL illuminating device L according to a third embodiment will be described. FIG. 8 shows organic EL elements 10 according to the third embodiment. Note that the same components as those of the organic EL illuminating device L of the first embodiment are indicted by the same reference characters as those of the first embodiment.

The organic EL illuminating device L of the third embodiment has the same configuration as that of the second embodiment, except that a space formed between a pair of substrates is filled with a heat dissipating resin 23. Note that the second substrate 21 is in the shape of a planar plate because of the filling with the heat dissipating resin 23.

The heat dissipating resin 23 is a material having a higher heat conductivity than that of the air. Examples of the heat dissipating resin 23 include an insulating acrylic rubber, ethylene propylene rubber, etc.

The space formed between the pair of substrates may be completely or partially filled with the heat dissipating resin 23. The density of the heat dissipating resin 23 filling the space may be arbitrary.

With this configuration, the space formed between the pair of substrates is filled with the heat dissipating resin 23, and therefore, heat generated during light emission in the organic EL element 10 can be efficiently transferred to the outside. Therefore, the heat during light emission more easily escapes to the outside, whereby accumulation of heat in the organic EL element 10 which causes damage to the organic layer can be reduced or prevented.

The organic EL illuminating device L having the above configuration can be manufactured by the same method as that of the first embodiment.

Other Embodiments

In the first to third embodiments, the first substrate 20 is assumed to have a planar plate-like shape. Alternatively, for example, the first substrate 20 may have a curved surface.

In the first embodiment, the organic EL illuminating device L is attached to the first substrate 20 with the support substrate thereof contacting the first substrate 20. Alternatively, as shown in FIG. 4, the organic EL illuminating device L may be attached to the first substrate 20 with the second electrode 14 thereof contacting the first substrate 20.

INDUSTRIAL APPLICABILITY

The present invention is useful for organic EL illuminating devices and methods for manufacturing the organic EL illuminating devices.

DESCRIPTION OF REFERENCE CHARACTERS

L ORGANIC EL ILLUMINATING DEVICE
10 ORGANIC EL ELEMENT
11 SUPPORT BASE MEMBER
12 FIRST ELECTRODE
13 ORGANIC EL LAYER
14 SECOND ELECTRODE
20 FIRST SUBSTRATE (ONE OF TWO SUBSTRATES)
21 SECOND SUBSTRATE (THE OTHER SUBSTRATE)
23 HEAT DISSIPATING RESIN

The invention claimed is:

1. A method for manufacturing an organic electroluminescence illuminating device having a structure in which each of a plurality of organic electroluminescence elements is interposed between a first substrate and a second substrate facing each other, a light emitting surface of each of the organic electroluminescence elements has a portion that is not parallel to a light extraction surface of the entire illuminating device, and each of the organic electroluminescence elements includes a first electrode, an organic electroluminescence layer, and a second electrode, which are successively stacked on a support base member, the method comprising:
an organic electroluminescence element formation step of fabricating the organic electroluminescence elements by forming the first electrode, the organic layer, and the second electrode on the support base member which is conveyed in roll-to-roll processing, and then, cutting the support base member into the organic electroluminescence elements each having a predetermined length;

a test step of testing each of the organic electroluminescence elements fabricated in the organic electroluminescence element formation step to remove a defective product;

an attachment step of preparing the first substrate having a surface provided with a plurality of raised portions and attaching non-defective organic electroluminescence elements of the electroluminescence elements tested in the test step to each of the raised portions of the first substrate; and a sealing step of sealing the first substrate and the second substrate by stacking the second substrate on the first substrate to which the organic electroluminescence elements are attached in the attachment step, wherein in the attachment step, the non-defective organic electroluminescence elements are attached to the plurality of raised portions provided on the first substrate such that the non-defective organic electroluminescence elements are apart from one another.

2. The method for fabricating the organic electroluminescence illuminating device of claim 1, wherein
the light emitting surface of the organic electroluminescence element is a curved surface.

3. The method for fabricating the organic electroluminescence illuminating device of claim 1, wherein
the light emitting surface of the organic electroluminescence element is a planar surface, and is sloped relative to the light extraction surface of the illuminating device.

4. The method for fabricating the organic electroluminescence illuminating device of claim 1, wherein
the organic electroluminescence element is made of a flexible material.

5. The method for fabricating the organic electroluminescence illuminating device of claim 1, wherein
at least one of the pair of substrates is made of an optically transparent material.

6. The method for fabricating the organic electroluminescence illuminating device of claim 1, wherein
in the sealing step, a space formed between the first substrate and the second substrate is filled with a heat dissipating resin having a higher heat conductivity than that of the air.

7. The method for fabricating the organic electroluminescence illuminating device of claim 1, wherein
an extraction electrode is provided on a surface of the first substrate on which each of the organic electroluminescence elements is attached, the extraction electrode electrically connected to the first electrode of each of the organic electroluminescence elements.

8. The method for fabricating the organic electroluminescence illuminating device of claim 1, wherein
in the organic electroluminescence element formation step, the support base member is cut into the organic electroluminescence elements each having a predetermined length corresponding to each of the raised portions to form the organic electroluminescence elements apart from one another.

9. The method for fabricating the organic electroluminescence illuminating device of claim 1, wherein
in the attachment step, the organic electroluminescence elements are attached to one another so as to be aligned with one another, the first electrodes of the organic electroluminescence elements are connected together, and the second electrodes of the organic electroluminescence elements are connected together.

10. The method for fabricating the organic electroluminescence illuminating device of claim 1, wherein
the second substrate has a zigzag cross-section so as to correspond to a shape of a surface of the first substrate provided with the plurality of raised portions.

* * * * *